United States Patent
Kim et al.

(10) Patent No.: US 9,337,403 B2
(45) Date of Patent: May 10, 2016

(54) LIGHT EMITTING DEVICE PACKAGE

(71) Applicant: LG INNOTEK CO., LTD., Seoul (KR)

(72) Inventors: Byung Mok Kim, Seoul (KR); Hiroshi Kodaira, Seoul (KR); Ha Na Kim, Seoul (KR); Yuichiro Tanda, Seoul (KR); Satoshi Ozeki, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 76 days.

(21) Appl. No.: 14/149,547

(22) Filed: Jan. 7, 2014

(65) Prior Publication Data

US 2014/0191276 A1 Jul. 10, 2014

(30) Foreign Application Priority Data

Jan. 8, 2013 (KR) .................. 10-2013-0002145

(51) Int. Cl.
*H01L 33/00* (2010.01)
*H01L 33/58* (2010.01)
*H01L 33/48* (2010.01)
*H01L 33/56* (2010.01)

(52) U.S. Cl.
CPC ............... *H01L 33/58* (2013.01); *H01L 33/48* (2013.01); *H01L 33/56* (2013.01); *H01L 2224/48091* (2013.01); *H01L 2224/73265* (2013.01)

(58) Field of Classification Search
CPC .............. H01L 33/58; H01L 33/48; H01L 2224/48091; H01L 2224/73265; H01L 33/56; H01L 2924/00014
See application file for complete search history.

(56) References Cited

U.S. PATENT DOCUMENTS

| | | | | |
|---|---|---|---|---|
| 2007/0228392 | A1* | 10/2007 | Plank | H01L 25/0753 257/79 |
| 2010/0006877 | A1* | 1/2010 | Chen | G02B 19/0061 257/98 |
| 2010/0007267 | A1* | 1/2010 | Imai | F21K 9/13 313/503 |
| 2013/0002130 | A1* | 1/2013 | Sumida | H01L 51/5275 313/504 |
| 2013/0026525 | A1* | 1/2013 | Chen | H01L 33/62 257/98 |
| 2013/0208473 | A1* | 8/2013 | Palagashvili | B64D 11/00 362/246 |

* cited by examiner

*Primary Examiner* — Victor A Mandala
(74) *Attorney, Agent, or Firm* — Birch, Stewart, Kolasch & Birch, LLP

(57) ABSTRACT

Disclosed is a light emitting device package with improved light extraction efficiency. The light emitting device package includes a substrate, a light emitting device disposed on the substrate, and a light transmission unit disposed above the light emitting device, the light transmission unit being spaced from the light emitting device, wherein a distance between an upper surface of the light emitting device and the light transmission unit is 0.15 mm to 0.35 mm.

20 Claims, 6 Drawing Sheets

LIGHT EMITTING DEVICE PACKAGE

CROSS REFERENCE TO RELATED APPLICATION

This application claims priority under 35 U.S.C. §119 to Korean Patent Application No. 10-2013-0002145, filed in Korea on 8 Jan. 2013, which is hereby incorporated in its entirety by reference as if fully set forth herein.

TECHNICAL FIELD

Embodiments relate to a light emitting device package.

BACKGROUND

Light emitting devices such as light emitting diodes (LEDs) or laser diodes (LDs) using Group III-V or II-VI compound semiconductor materials render a variety of colors such as red, green, blue and ultraviolet in accordance with development of thin film growth methods and device materials, realize white light having high efficiency using fluorescent materials or through combination of colors, and have advantages such as low power consumption, semi-permanent lifespan, high response speed, safety and eco-friendliness, as compared to conventional light sources such as fluorescent lamps and incandescent lamps.

An application range of such a light emitting device has been extended to transmission modules of optical communication systems, light emitting diodes as replacements for cold cathode fluorescent lamps (CCFLs) constituting backlights of display devices such as liquid crystal displays (LCDs), and white light emitting diode lighting devices as replacements for fluorescent lamps or incandescent lamps, vehicle headlights and traffic lights.

There is a need for improvement of light extraction efficiency of a light emitting device package by rendering light generated by a light emitting device to be emitted to the outside, instead of being confined or absorbed in other components of the light emitting device package, when the light emitting device package including the light emitting device is manufactured.

SUMMARY

Embodiments provide a light emitting device package with improved light extraction efficiency.

In one embodiment, a light emitting device package includes a substrate, a light emitting device disposed on the substrate, and a light transmission unit disposed above the light emitting device, the light transmission unit being spaced from the light emitting device, wherein a distance between an upper surface of the light emitting device and the light transmission unit is 0.15 mm to 0.35 mm.

The light emitting device package may further include a support unit disposed on the substrate along a circumference of the substrate, wherein the light transmission unit is supported by the support unit.

The support unit may include a first region disposed in a first direction parallel to the light transmission unit and a second region disposed in a second direction different from the first direction, wherein the first region contacts the light transmission unit.

The first region may extend along the first direction from an end of the second region.

The first region may extend along the first direction from a middle portion of the second region.

The light transmission unit may contact a side of the first region, facing a bottom surface of the substrate.

The light emitting device may emit light having a wavelength range of 260 nm to 405 nm.

The substrate may include a ceramic material.

The light emitting device may be wire-bonded to the substrate.

The first direction may cross the second direction at a right angle.

The light emitting device package may further include a sub-mount disposed between the substrate and the light emitting device.

A space between the light-transmitting unit and the light emitting device may be vaccumized.

A space between the light-transmitting unit and the light emitting device may be filled with a nitrogen gas or a forming gas.

The light-transmitting unit may include $SiO_2$, $Al_2O_3$, LiF, $MgF_2$, $CaF_2$, low iron transparent glass or $B_2O_3$.

The support unit may include at least one of Al, Ag, Pt, Rh, Rd, Pd and Cr, or an alloy containing at least one thereof.

In another embodiment, a light emitting device package includes a substrate having a cavity including a side wall and a bottom surface, a light emitting device disposed in the cavity, a support unit including a first region and a second region bent from the first region and disposed on the side wall of the cavity, and a light-transmitting unit adhered to the first region such that the light-transmitting unit is spaced from the light emitting device, the light-transmitting unit transmitting light emitted from the light emitting device.

A distance between the upper surface of the light emitting device and the light-transmitting unit may be 0.15 mm to 0.35 mm.

The light emitting device may emit light having a wavelength range of 260 nm to 405 nm.

The light emitting device package may further include a sub-mount disposed between the substrate and the light emitting device.

The substrate may include a single layer or a plurality of layers.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
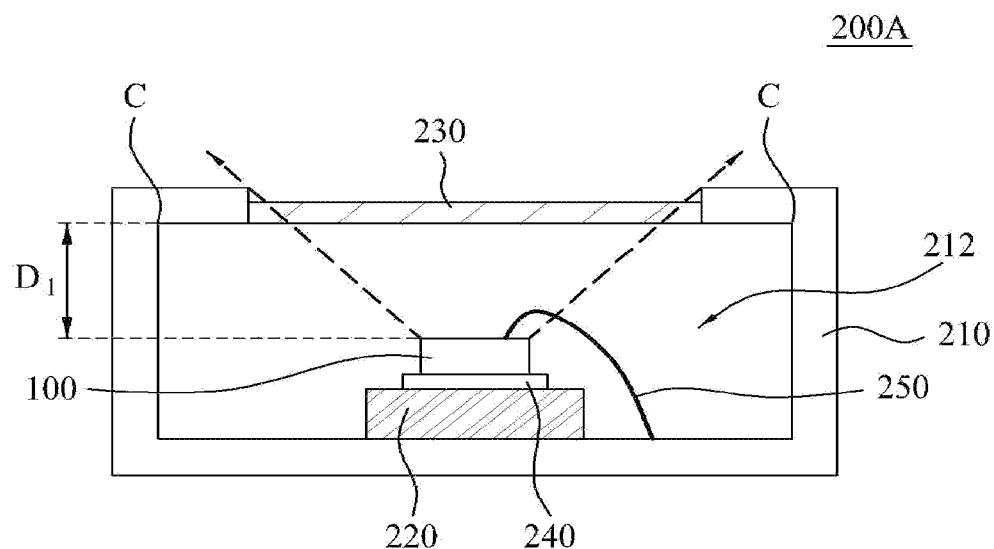
FIGS. 1 and 2 are cross-sectional views illustrating a light emitting device package according to a first embodiment.

Hereinafter, embodiments will be described with reference to the annexed drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

In the drawings, the thickness or size of each layer is exaggerated, omitted, or schematically illustrated for convenience of description and clarity. In addition, the size or area of each constituent element does not entirely reflect the actual size thereof.

Figure 2:
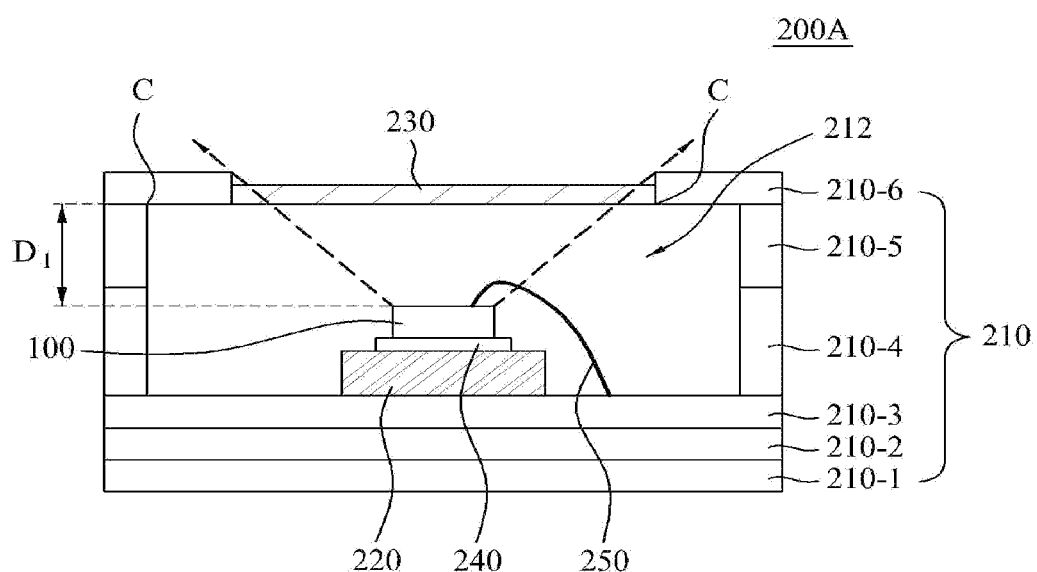

FIGS. 1 and 2 are cross-sectional views illustrating a light emitting device package according to a first embodiment.

Referring to FIG. 1, the light emitting device package 200A according to the first embodiment includes a substrate 210, a light emitting device 100 and a light transmission unit 230.

The substrate 210 may comprise a ceramic material. For example, the substrate 210 may be implemented with a high temperature cofired ceramic (HTCC) or low temperature cofired ceramic (LTCC) method. The substrate 210 may comprise an insulating material such as a nitride or oxide, examples of which include $SiO_2$, $Si_xO_y$, $Si_3N_y$, $SiO_xN_y$, $Al_2O_3$ or AlN.

The substrate 210 may include a single layer or a plurality of layers. When the substrate 210 includes the plurality of layers, thicknesses of the respective layers may be identical or different. When the substrate 210 includes the plurality of layers, the respective layers may be separate layers which are distinguished from one another during a manufacturing process and may be integrated after completion of firing. An example of the case in which the substrate 210 includes the plurality of layers is shown in FIG. 2. A case in which the substrate 210 includes a plurality of layers 210-1 to 210-6 is shown in FIG. 2, but the number of layers constituting the substrate 210 may be changed according to embodiment.

Although not illustrated, the substrate 210 may be provided with a via hole and the via hole may be a conductive via hole including a conductive material. The conductive via hole may be electrically connected to an electrode pattern of the substrate 210.

The substrate 210 may be provided with a cavity 212 having a side wall and a bottom surface. A light emitting device 100 is disposed in the cavity 212. The side wall of the cavity 212 may include an inclined surface to reflect light produced in the light emitting device 100 upward and thereby improve light extraction efficiency.

At least a part of the side wall and the bottom surface of the cavity 212 may be coated, plated or deposited with a reflective member (not shown).

The light emitting device 100 includes a light emitting diode (LED) using a plurality of compound semiconductor layers, for example, Group III-V or Group II-VI semiconductor layers, and the LED may be a color LED emitting light such as blue, green or red light, a white LED or a UV LED. Light emitted from the LED may be variably implemented by changing types and concentrations of materials constituting semiconductor layers and the present disclosure is not limited thereto. When the light emitting device 100 is a UV LED emitting UV, it emits light having a wavelength of 260 nm to 405 nm.

Figure 3:
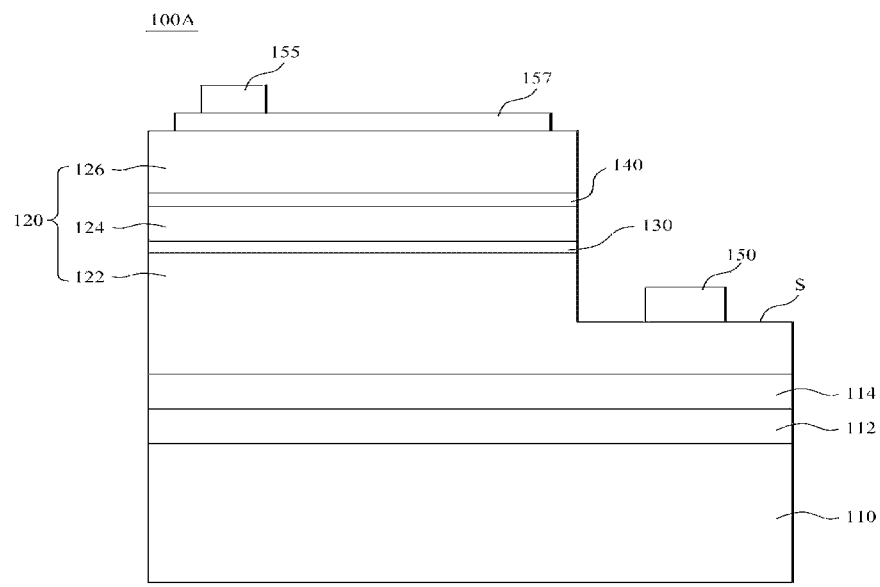
FIG. 3 is a cross-sectional view illustrating an example of a light emitting device applicable to the light emitting device package according to the present embodiment.

FIG. 3 is a cross-sectional view illustrating an example of a light emitting device applicable to the light emitting device package according to the present embodiment.

Referring to FIG. 3, the light emitting device 100A according to the example includes a substrate 110, a light emitting structure 120 disposed on the substrate 110 and including a first semiconductor layer 122, an active layer 124 and a second semiconductor layer 126, a first electrode 150 disposed on a side of the first semiconductor layer 122 and a second electrode 155 disposed on a side of the second semiconductor layer 126.

The light emitting device 100A according to the example may be a lateral light emitting device.

The lateral light emitting device means a structure in which the first electrode 150 and the second electrode 155 are formed in the same direction with respect to the light emitting structure 120. For example, referring to FIG. 3, the first electrode 150 and the second electrode 155 are formed in an upper direction of the light emitting structure 120.

The growth substrate 110 may be formed of a material which is suitable for semiconductor material growth and has superior thermal conductivity. The growth substrate 110 may be, for example, at least one of sapphire ($Al_2O_3$), SiC, GaAs, GaN, ZnO, Si, GaP, InP, Ge and $Ga_2O_3$. Impurities present on the surface of the growth substrate 110 may be removed by wet cleaning or plasma treatment.

The light emitting structure 120 may, for example, be formed by methods including metal organic chemical vapor deposition (MOCVD), chemical vapor deposition (CVD), plasma-enhanced chemical vapor deposition (PECVD), molecular beam epitaxy (MBE) or hydride vapor phase epitaxy (HVPE), but the present disclosure is not limited thereto.

A buffer layer 112 may be disposed between the light emitting structure 120 and the growth substrate 110. The buffer layer 112 functions to reduce differences in lattice mismatch and thermal expansion coefficient between materials of the light emitting structure 120 and the growth substrate 110. The material for the buffer layer 112 may be a Group III-V compound semiconductor or a Group II-VI compound semiconductor, for example, at least one of GaN, InN, AlN, InGaN, InAlGaN, and AlInN. The buffer layer 112 may be grown at a temperature lower than a growth temperature of the light emitting structure 120.

The light emitting structure 120 includes the first semiconductor layer 122, the active layer 124 and the second semiconductor layer 126 in a direction far from the growth substrate 110.

The first semiconductor layer 122 may be formed of a semiconductor compound, for example, a Group III-V or Group II-VI semiconductor compound. In addition, the first semiconductor layer 122 may be doped with a first conductive type dopant. When the first semiconductor layer 122 is an n-type semiconductor layer, the first conductive type dopant is an n-type dopant. Examples of the n-type dopant include, but are not limited to, Si, Ge, Sn, Se, Te and the like. When the first semiconductor layer 122 is a p-type semiconductor layer, the first conductive type dopant is a p-type dopant. Examples of the p-type dopant include, but are not limited to, Mg, Zn, Ca, Sr, Ba and the like.

The first semiconductor layer 122 may comprise a semiconductor material having an empirical formula of $Al_xIn_yGa_{(1-x-y)}N$ ($0 \leq x \leq 1$, $0 \leq y \leq 1$, $0 \leq x+y \leq 1$). The first semiconductor layer 122 may comprise at least one element of Ga, N, In, Al, As and P, and may be formed of at least one of GaN, InN, AlN, InGaN, AlGaN, InAlGaN, AlInN, AlGaAs, InGaAs, AlInGaAs, GaP, AlGaP, InGaP, AlInGaP and InP. When the light emitting device 100A is a UV light emitting device emitting UV light, the first semiconductor layer 122 may comprise Al.

An undoped semiconductor layer 114 may be disposed between the growth substrate 110 and the first semiconductor layer 122. The undoped semiconductor layer 114 functions to improve crystallinity of the first semiconductor layer 122 and is formed of a material which is the same as or different from that of the first semiconductor layer 122. Since the undoped semiconductor layer 114 is not doped with the first conductive type dopant, it has a lower electrical conductivity than the first semiconductor layer 122. The undoped semiconductor layer 114 is disposed on the buffer layer 112 so as to contact the first semiconductor layer 122. The undoped semiconductor layer 114 is grown at a higher temperature than a growth temperature of the buffer layer 112 and has better crystallinity than the buffer layer 112.

The second semiconductor layer 126 is formed of a semiconductor compound, for example, a Group III-V or II-VI semiconductor compound. In addition, the second semiconductor layer 126 may be doped with a second conductive type dopant. When the second semiconductor layer 126 is a p-type semiconductor layer, the second conductive type dopant is a p-type dopant and examples of the p-type dopant include, but are not limited to, Mg, Zn, Ca, Sr, Ba and the like. When the second semiconductor layer 126 is an n-type semiconductor layer, the second conductive type dopant is an n-type dopant, and examples of the n-type dopant include, but are not limited to, Si, Ge, Sn, Se and Te.

The second semiconductor layer 126 may comprise a semiconductor material having an empirical formula of $Al_xIn_yGa_{(1-x-y)}N$ ($0 \leq x \leq 1$, $0 \leq y \leq 1$, $0 \leq y \leq 1$). The second semiconductor layer 126 may comprise at least one element of Ga, N, In, Al, As and P, and is formed of at least one of GaN, InN, AlN, InGaN, AlGaN, InAlGaN, AlInN, AlGaAs, InGaAs, AlInGaAs, GaP, AlGaP, InGaP, AlInGaP, and InP. When the light emitting device 100A is a UV light emitting device emitting UV light, the second first semiconductor layer 126 may comprise Al.

Hereinafter, a case in which the first semiconductor layer 122 is an n-type semiconductor layer and the second semiconductor layer 126 is a p-type semiconductor layer will be described by way of example.

A semiconductor having a polarity opposite to the second conductive type may be formed on the second semiconductor layer 126. For example, when the second semiconductor layer 126 is a p-type semiconductor layer, an n-type semiconductor layer (not shown) is formed on the second semiconductor layer 126. Accordingly, the light emitting structure 120 may be implemented with one of n-p junction, p-n junction, n-p-n junction and p-n-p junction structures.

The active layer 124 is disposed between the first semiconductor layer 122 and the second semiconductor layer 126. The active layer 124 emits light having energy determined by an inherent energy band of an active layer (light emitting layer) material upon recombination of electrons and holes. When the first semiconductor layer 122 is the n-type semiconductor layer and the second semiconductor layer 126 is the p-type semiconductor layer, electrons are injected from the first semiconductor layer 122 and holes are injected from the second semiconductor layer 126. When the light emitting device 100A is a UV LED, the active layer 124 may emit light having a wavelength of about 260 nm to about 405 nm.

The active layer 124 may have at least one of a monoquantum well structure, a multi-quantum well (MQW) structure, a quantum wire structure and a quantum dot structure. For example, the active layer 124 may have a multi-quantum well structure formed by injecting trimethyl gallium gas (TMGa), ammonia gas ($NH_3$), nitrogen gas ($N_2$), or trimethyl indium gas (TMIn). However, the material and structure of the active layer 124 are not limited thereto.

When the active layer 124 has a multi-quantum well (MQW) structure, the well layer/barrier layer of the active layer 124 may have at least one pair structure of InGaN/GaN, InGaN/InGaN, GaN/AlGaN, InAlGaN/GaN, GaAs(InGaAs)/AlGaAs and GaP(InGaP)/AlGaP, without being limited thereto. The well layer may be made of a material having a smaller band gap than the barrier layer.

A stress buffer layer 130 may be disposed between the first semiconductor layer 122 and the active layer 124. The stress buffer layer 130 reduces lattice mismatch between the first semiconductor layer 122 and the active layer 124. The stress buffer layer 130 may have a super-lattice structure in which a plurality of well layers and a plurality of barrier layers are alternately laminated. The well layer/barrier layer of the stress buffer layer 130 may have at least one pair structure of InGaN/GaN, InGaN/InGaN, GaN/AlGaN, InAlGaN/GaN, GaAs(InGaAs)/AlGaAs and GaP(InGaP)/AlGaP, without being limited thereto. The well layer of the stress buffer layer 130 may be made of a material having a larger band gap than that of the active layer 124.

An electron blocking layer 140 may be disposed between the second semiconductor layer 126 and the active layer 124. According to embodiment, the electron blocking layer 140 may be disposed adjacent to the active layer 124 in the second semiconductor layer 126. The electron blocking layer 140 serves as a potential barrier preventing a phenomenon in which electrons supplied from the first semiconductor layer 122 do not contribute to light emission due to high mobility, escape to the second semiconductor layer 126 above the active layer 124 and cause current leakage. The electron blocking layer 140 is formed of a material having a larger energy band gap than the active layer 124 and is formed of a semiconductor material having a formula of $In_xAl_yGa_{1-x-y}N$ ($0 \leq x < y < 1$). The electron blocking layer 140 may be doped with the second conductive type dopant.

The light emitting structure 120 includes an exposure surface S to expose a part of the first semiconductor layer 122 through partial etching of the second semiconductor layer 126, the active layer 124 and the first semiconductor layer 122. The first electrode 150 is disposed on the exposure surface S. The second electrode 155 is disposed in an unexposed part of the second semiconductor layer 126.

The first electrode 150 and the second electrode 155 may employ a monolayer or multilayer structure including at least one of molybdenum (Mo), chromium (Cr), nickel (Ni), gold (Au), aluminum (Al), titanium (Ti), platinum (Pt), vanadium (V), tungsten (W), lead (Pd), copper (Cu), rhodium (Rh), and iridium (Ir).

Before formation of the second electrode 155, a conductive layer 157 may be formed on the second semiconductor layer 126. According to embodiment, the conductive layer 157 is partially opened, so that the second semiconductor layer 126 is exposed and the second semiconductor layer 126 thus contacts the second electrode 155. Alternatively, as shown in FIG. 3, the second semiconductor layer 126 is electrically connected to the second electrode 155 via the conductive layer 157.

The conductive layer 157 improves electrical properties of the second semiconductor layer 126 and enhances electrical contact between the second semiconductor layer 126 and the second electrode 155, which is formed as a layer or a plurality of patterns. The conductive layer 157 may be formed as a light-transparent electrode layer.

The conductive layer 157 may be selected form a light-transmitting conductive layer and a metal, and examples of the material for the conductive layer 157 include, but are not limited to, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, or Ni/IrOx/Au/ITO, Ag, Ni, Cr, Ti, Al, Rh, Pd, Ir, Sn, In, Ru, Mg, Zn, Pt, Au, Hf and combinations thereof.

Figure 4:
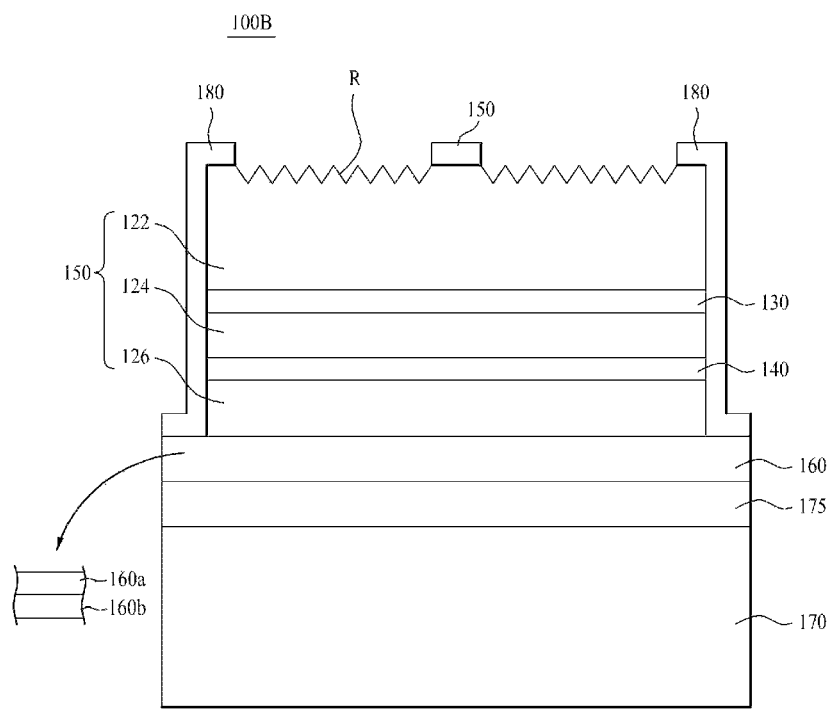
FIG. 4 is a cross-sectional view illustrating another example of a light emitting device applicable to the light emitting device package of the present embodiment.

FIG. 4 is a cross-sectional view illustrating another example of a light emitting device applicable to the light emitting device package of the present embodiment. Features equal to those described above will be omitted herein and the description will be based upon differences therebetween.

Referring to FIG. 4, the light emitting device 100B includes a light emitting structure 120 including a first semiconductor layer 122, an active layer 124 and a second semiconductor layer 126, a first electrode 150 disposed at a side of the first semiconductor layer 122 and a second electrode layer 160 disposed at a side of the second semiconductor layer 126.

The light emitting device 100B according to the example may be a vertical light emitting device.

The vertical light emitting device is a structure in which the first electrode 150 and the second electrode layer 160 are formed in different directions in the light emitting structure 120. For example, as shown in FIG. 4, the first electrode 150 is formed in an upward direction of the light emitting structure 120 and the second electrode layer 160 is formed in a downward direction of the light emitting structure 120.

A light extraction pattern R may be disposed in the first semiconductor layer 122. The light extraction pattern R may be formed by photo-enhanced chemical (PEC) etching or etching using a mask pattern. The light extraction pattern R improves external extraction efficiency of light generated in the active layer 124 and may have regular patterns or be irregularly formed.

The second electrode layer 160 may include at least one of a conductive layer 160a and a reflective layer 160b. The conductive layer 160a functions to improve electrical properties of the second semiconductor layer 126 and contacts the second semiconductor layer 126.

The conductive layer 160a may be a transparent electrode layer or a non-transparent electrode layer and examples of materials for formation of the conductive layer 160a include, but are not limited to, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, or Ni/IrOx/Au/ITO, Ag, Ni, Cr, Ti, Al, Rh, Pd, Ir, Sn, In, Ru, Mg, Zn, Pt, Au, Hf and combinations thereof.

The reflective layer 160b reflects light generated in the active layer 124 and thereby reduces a dose of light decayed in the light emitting device and improves external quantum efficiency of the light emitting device.

The reflective layer 160b may comprise at least one of Ag, Ti, Ni, Cr, and Cu, and may be AgCu, but the material for formation of the reflective layer 160b is not limited thereto. When the reflective layer 160b is formed of a material which ohmic-contacts the second semiconductor layer 126, the conductive layer 160a may be not separately formed.

The light emitting structure 120 is supported by a support substrate 170.

The support substrate 170 is formed of a material having high electrical conductivity and high thermal conductivity, is for example a base substrate having a predetermined thickness and is formed of a metal selected from the group consisting of molybdenum (Mo), silicon (Si), tungsten (W), copper (Cu) and aluminum (Al), or an alloy thereof. In addition, the support substrate 170 may optionally include gold (Au), a Cu alloy, nickel (Ni), copper-tungsten (Cu—W), a carrier wafer (e.g., GaN, Si, Ge, GaAs, ZnO, SiGe, SiC, SiGe, or $Ga_2O_3$) or a conductive sheet.

The light emitting structure 120 may be bonded to the support substrate 170 via a bonding layer 175. The second electrode layer 160 and the bonding layer 175 disposed under the light emitting structure 120 may contact each other.

The bonding layer 175 comprises a barrier metal or a bonding metal and examples of the material for the bonding layer 175 include, but are not limited to, Ti, Au, Sn, Ni, Cr, Ga, In, Bi, Cu, Ag, Ta and combinations thereof.

The bonding layer 175 includes an anti-diffusion layer (not shown) adjacent to the light emitting structure 120 to prevent diffusion of a material such as metal used for the bonding layer 175 into the light emitting structure 120 disposed thereabove.

A passivation layer 180 may be disposed in at least a part of side and upper surfaces of the light emitting structure 120.

The passivation layer 180 is formed of oxide or nitride and protects the light emitting structure 120. For example, the passivation layer 180 may be a non-conductive material layer such as a silicon oxide $SiO_2$ layer, a silicon nitride layer, an oxide nitride layer or an oxide aluminum layer, but is not limited thereto.

Although not shown, when the passivation layer 180 is disposed on the upper surface of the light emitting structure 120 as well, the light extraction pattern R may be formed in the passivation layer 180.

Referring to FIG. 1, a sub-mount 220 may be disposed between the light emitting device 100 and the substrate 210. That is, the light emitting device 100 is disposed on the sub-mount 220 and is mounted on the substrate 210.

The sub-mount 220 may be a conductive substrate or an insulating substrate. A material for formation of the sub-mount 220 may be determined in consideration of thermal conductivity and thermal expansion coefficient, may be a material having a median thermal expansion coefficient between that of the light emitting device 100 and the substrate 210, and examples of the material include Si, SiC, AlN and the like. Because heat generated by the light emitting device 100 is dissipated to the outside through substrate 210 after passing through the sub-mount 220, the sub-mount 220 may be formed of a material having superior thermal conductivity.

The light emitting device 100 may be fixed on the sub-mount 220 through the bonding layer 240. The bonding layer 240 is for example an Ag paste or an Au—Sn solder.

The light emitting device 100 may be electrically connected to the substrate 210 through wire 250 bonding. Although not shown, the wire 250 may be bonded to the electrode pattern on the substrate 210.

A light transmission unit 230 is disposed above the light emitting device 100 so as to be spaced from the light emitting device 100. The light transmission unit 230 may be formed of a transparent material and a non-reflective coating film to transmit light generated in the light emitting device 100, instead of absorbing the light, and examples of the material include $SiO_2$ (Quartz, UV fused silica), $Al_2O_3$ (Sapphire), $LiF$, $MgF_2$, $CaF_2$, low iron transparent glass, $B_2O_3$ or the like. The light transmission unit 230 protects the light emitting device 100 and the wire 250, controls light transmission properties according to wavelength, based on different surface coating and thereby improves light emission efficiency of specific wavelengths. The light transmission unit 230 prevents destruction or degeneration of an organic substance of the light emitting device package 200A caused by UV light emitted from the light emitting device 100, when the light emitting device 100 is a UV LED.

A space between the light transmission unit 230 and the light emitting device 100 may be vacuumized or may be filled with a nitrogen gas ($N_2$) or a forming gas.

The light transmission unit 230 is directly or indirectly supported by the substrate 210. The light transmission unit 230 is fixed to the substrate 210 such that a side of the light transmission unit 230 is adhered to the substrate 210 and a fixing method of the light transmission unit 230 is not limited.

A distance D between an upper surface of the light emitting device 100 and the light transmission unit 230 is 0.15 mm to 0.35 mm. That is, a distance D between a light emission surface of the light emitting device 100 and the light transmission unit 230 is 0.15 mm to 0.35 mm.

The distance D between the light emission surface of the light emitting device 100 and the light transmission unit 230 should be determined in consideration of light extraction efficiency and processability. When the distance D is less than 0.15 mm, a minimum margin for wire bonding cannot be secured, and when the distance D exceeds 0.35 mm, light loss may be caused because an internal material or angle of light incident upon the light transmission unit 230 may not be within optimal ranges in the space between the light transmission unit 230 and the light emitting device 100, and light extraction efficiency is deteriorated because a part of light generated in the light emitting device 100 is trapped in an edge C of the substrate 210 supporting the light transmission unit 230 and is thus not discharged to the outside.

Figure 5:
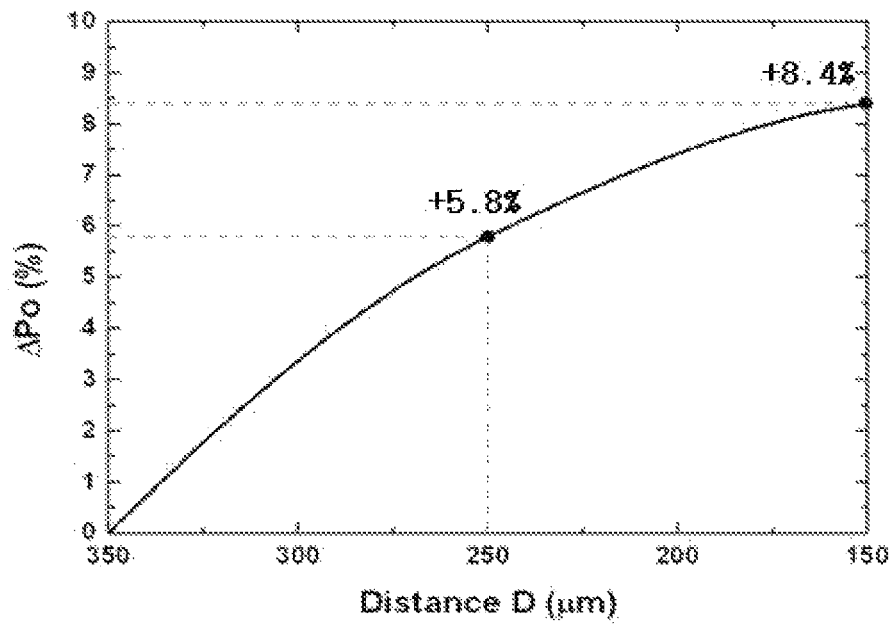
FIG. 5 is a graph showing test results of light output power of the light emitting device package as a function of distance between an upper surface of the light emitting device and a light transmission unit.

FIG. 5 is a graph showing test results of light output power of the light emitting device package as a function of distance between the upper surface of the light emitting device and the light transmission unit. The following Table 1 shows actual values of FIG. 4.

TABLE 1

| Distance D (um) | Po [mW] | Po variation (%) |
|---|---|---|
| 350 | 0.4958 | — |
| 250 | 0.5684 | +5.8 |
| 150 | 0.5993 | +8.4 |

Testing was carried out by measuring light output power when the distances D between the upper surface of the light emitting device 100 and the light transmission unit 230 were 0.35 mm (350 um), 0.25 mm (250 um), and 0.15 mm (150 um). When the distance D between the upper surface of the light emitting device 100 and the light transmission unit 230 is 0.35 mm (350 um), the light output power is 0.4958 mW which is an effective level for use as a light source. When the distance D between the upper surface of the light emitting device 100 and the light transmission unit 230 is decreased to 0.25 mm (250 um) and 0.15 mm (150 um), light output power is increased by 5.8% and 8.4%, respectively, as compared to when the distance is 0.35 mm (350 um). The range of 0.15 mm to 0.35 mm is determined as an optimum value of the distance D between the upper surface of the light emitting device 100 and the light transmission unit 230 in consideration of effective light output power and reliability, because it is difficult to decrease the distance D between the upper surface of the light emitting device 100 and the light transmission unit 230 to a level less than 0.15 mm in terms of reliability during wire bonding.

For example, the distance D between the upper surface of the light emitting device 100 and the light transmission unit 230 may be controlled by a thickness of the sub-mount 220.

As can be seen from test results, light output power according to the distance D between the upper surface of the light emitting device 100 and the light transmission unit 230 is improved, regardless of parameters such as a size of the light emitting device 100 (for example, the size of the light emission area), a size of the light transmission unit 230 or an orientation angle.

Figure 6:
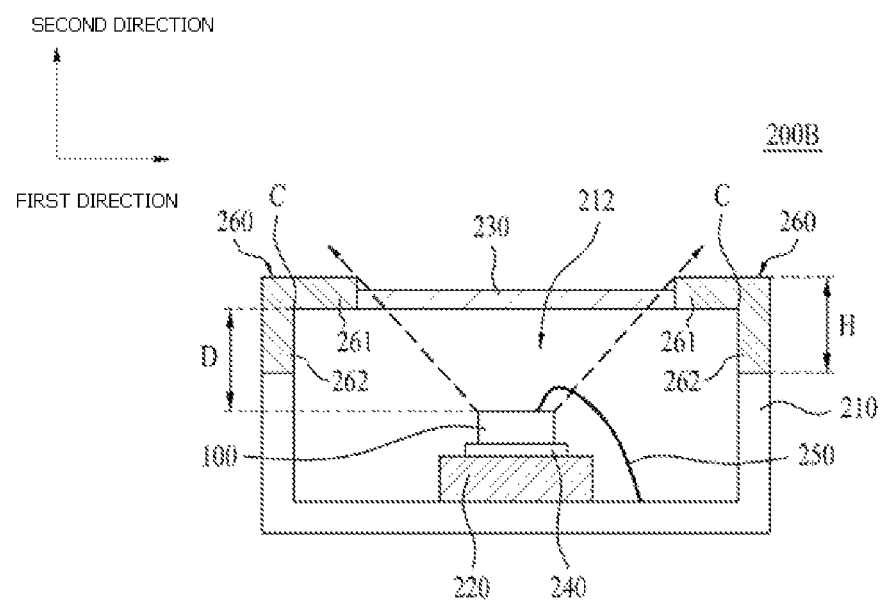
FIG. 6 is a cross-sectional view of a light emitting device package according to a second embodiment.

FIG. 6 is a cross-sectional view of a light emitting device package according to a second embodiment. Features equal to those described above will be omitted herein and the description will be based upon differences therebetween.

Referring to FIG. 6, the light emitting device package 200B includes a substrate 210, a light emitting device 100, a light transmission unit 230 and a support unit 260.

The support unit 260 supports the light transmission unit 230 and is disposed along a circumference of the substrate 210 in an upper part of the substrate 210. When the substrate 210 has a cavity 212, the support unit 260 may be disposed on the side wall of the cavity 212. The side of the light transmission unit 230 is adhered to and fixed to the support unit 260 and the fixing method of the light transmission unit 230 is not limited.

The support unit 260 may be formed of a metal material, for example, at least one of aluminum (Al), silver (Ag), platinum (Pt), rhodium (Rh), radium (Rd), palladium (Pd), chromium (Cr), or an alloy thereof, but the material for formation of the support unit 260 is not limited thereto. The surface of the support unit 260 facing the light emitting device 100 may be coated, plated or deposited with a reflective member (not shown).

The support unit 260 includes a first region 261 disposed in a first direction parallel to the light transmission unit 230 and a second region 262 disposed in a second direction different from the first direction. The first region 261 of the support unit 260 contacts the light transmission unit 230 and the second region 262 thereof contacts the substrate 210. For example, the first region 261 may contact the side of the light transmission unit 230 and the second region 262 may contact the sidewall of the cavity 212. According to embodiment, the first direction may cross the second direction at a right angle.

The first region 261 of the support unit 260 may extend along the first direction from an end of the second region 262. FIG. 5 shows an example in which the second region 262 is formed along the first direction from an upper end of the first region 261 far from the light emitting device 100, among both ends of the first region 261.

For example, the support unit 260 may include the first region 261 and the second region 262 which is bent from the first region 261 and is formed on a side wall of the cavity 212. The first region 261 may be parallel to an upper or lower surface of the light transmission unit 260, and the first region 261 may cross the second region 262 at right angles, but the position is not limited thereto.

The light transmission unit 230 is disposed above the light emitting device 100 so as to be spaced from the light emitting device 100, is adhered to and fixed to the first region 261 of the support unit 260 and transmits light emitted from the light emitting device 100.

For example, light emitted from the light emitting device 100 can be discharged to the outside only through the light transmission unit 230 because the side wall of the cavity 212 of the substrate 210 and the support unit 260 are formed of a light-reflecting material.

When the light emitting device package 200B includes the support unit 260, the second region 262 of the support unit 260 should secure a predetermined height H in terms of processability such as movement and disposition of the support unit 260. Accordingly, the first region 261 of the support unit 260 may be formed at a position which secures the predetermined height H of the second region 262 and satisfies the distance D between the upper surface of the light emitting device 100 and the light transmission unit 230, of 0.15 mm to 0.35 mm, when the light transmission unit 230 is disposed. In order words, the position of the first region 261 of the support unit 260 and fixing methods of the first region 261 and the light transmission unit 230 and the like are determined so as to secure the predetermined height H of the second region 262 and satisfy the distance D between the upper surface of the light emitting device 100 and the light transmission unit 230, of 0.15 mm to 0.35 mm, when the light transmission unit 230 is disposed, but the position and the fixing method are not limited to specific examples of the embodiments.

When the distance D between the upper surface of the light emitting device 100 and the light transmission unit 230 is less than 0.15 mm, a minimum margin for wire bonding cannot be secured, and when the distance D is greater than 0.35 mm, a part of light generated in the light emitting device 100 is trapped in an edge C of the substrate 210 supporting the light transmission unit 230 and is thus not discharged to the outside, and light extraction efficiency is thus deteriorated.

The sub-mount 220 may be disposed between the light emitting device 100 and the substrate 210. That is, the light emitting device 100 is disposed on the sub-mount 220, while being mounted on the substrate 210.

For example, the distance D between the upper surface of the light emitting device 100 and the light transmission unit 230 may be controlled by a thickness of the sub-mount 220. Alternatively, the distance D between the upper surface of the light emitting device 100 and the light transmission unit 230 may be controlled by changing a position of the first region 261 of the support unit 260.

Figure 7:
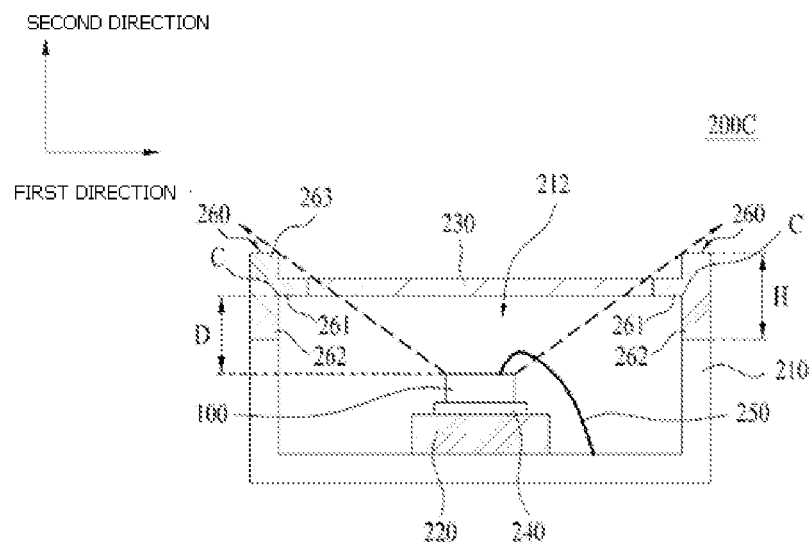
FIG. 7 is a cross-sectional view of a light emitting device package according to a third embodiment.

FIG. 7 is a cross-sectional view of a light emitting device package according to a third embodiment. Features equal to those described above will be omitted herein and the description will be based upon differences therebetween.

Referring to FIG. 7, the light emitting device package 200C according to the present embodiment includes a substrate 210, a light emitting device 100, a light transmission unit 230 and a support unit 260.

The support unit 260 includes a first region 261 disposed in a first direction parallel to the light transmission unit 230 and a second region 262 disposed in a second direction different from the first direction. The first region 261 of the support unit 260 contacts the light transmission unit 230 and the second region 262 thereof contacts the substrate 210. According to embodiment, the first direction may cross the second direction at a right angle.

The first region 261 of the support unit 260 may extend along the first direction from a middle portion of the second region 262. The middle portion of the second region 262 means an area present between both ends of the second region 262. A portion of the second region 262 which is positioned above the first region 261 is referred to as a third region 263 and the third region 263 reflects light passing through the light transmission unit 230 and thereby controls a light orientation angle.

When the light emitting device package 200C includes the support unit 260, the second region 262 of the support unit 260 should secure a predetermined height H in terms of processability such as movement and disposition of the support unit 260. Accordingly, the first region 261 of the support unit 260 may be formed at a position which secures the predetermined height H of the second region 262 and satisfies the distance D between the upper surface of the light emitting device 100 and the light transmission unit 230, of 0.15 mm to 0.35 mm, when the light transmission unit 230 is disposed. In order words, the position of the first region 261 of the support unit 260 and fixing methods of the first region 261 and the light transmission unit 230 and the like are determined so as to secure the predetermined height H of the second region 262 and satisfy the distance D between the upper surface of the light emitting device 100 and the light transmission unit 230, of 0.15 mm to 0.35 mm, when the light transmission unit 230 is disposed, and the position and fixing method are not limited to specific examples of the embodiments.

When the distance D between the upper surface of the light emitting device 100 and the light transmission unit 230 is less than 0.15 mm, a minimum margin for wire bonding cannot be secured, and when the distance D exceeds 0.35 mm, a part of light generated in the light emitting device 100 is trapped in an edge C of the substrate 210 supporting the light transmission unit 230 and is thus not discharged to the outside, and light extraction efficiency is thus deteriorated.

For example, the light transmission unit 230 contacts a side of the first region 261 which extends along the first direction from the middle portion of the second region 262.

The sub-mount 220 may be disposed between the light emitting device 100 and the substrate 210. That is, the light emitting device 100 is disposed on the sub-mount 220 while being mounted on the substrate 210.

For example, the distance D between the upper surface of the light emitting device 100 and the light transmission unit 230 may be controlled by a thickness of the sub-mount 220. Alternatively, the distance D between the upper surface of the light emitting device 100 and the light transmission unit 230 may be controlled by changing a position of the first region 261 of the support unit 260.

Figure 8:
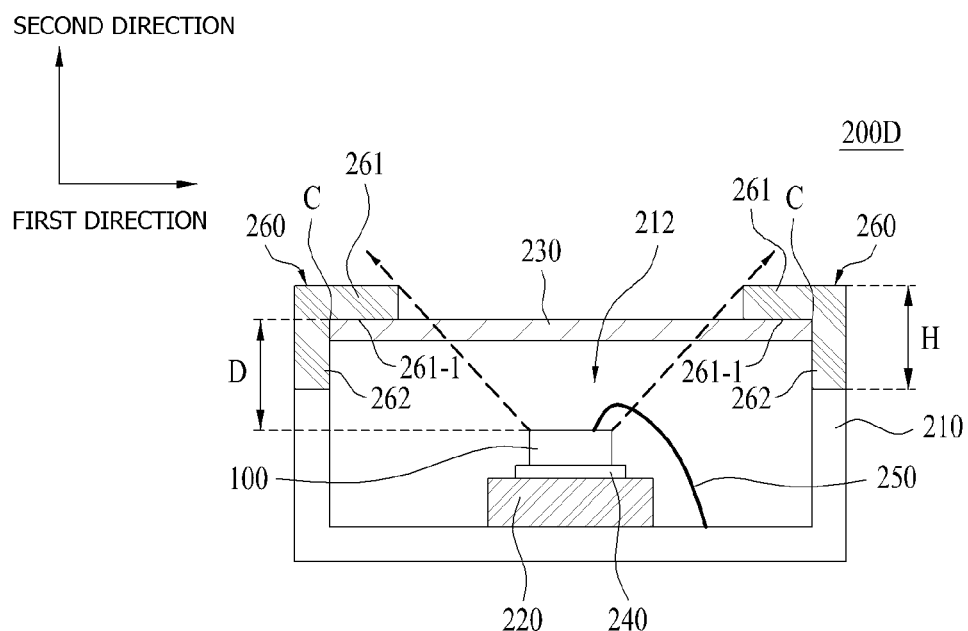
FIG. 8 is a cross-sectional view of a light emitting device package according to a fourth embodiment.

FIG. 8 is a cross-sectional view of a light emitting device package 200D according to a fourth embodiment. Features equal to those described above will be omitted herein and the description will be based upon differences therebetween.

Referring to FIG. 8, the light emitting device package 200D according to the present embodiment includes a substrate 210, a light emitting device 100, a light transmission unit 230 and a support unit 260.

The support unit 260 includes a first region 261 disposed in a first direction parallel to the light transmission unit 230 and a second region 262 disposed in a second direction different from the first direction. The first region 261 of the support unit 260 contacts the light transmission unit 230 and the second region 262 thereof contacts the substrate 210. According to embodiment, the first direction may cross the second direction at a right angle.

The first region 261 of the support unit 260 may extend along the first direction from an end of the second region 262. FIG. 8 shows an example in which the second region 262 is formed along the first direction from an upper end far from the light emitting device 100, among both ends of the first region 261.

When the light emitting device package 200D includes the support unit 260, the second region 262 of the support unit 260 should secure a predetermined height H in terms of processability such as movement and disposition of the support unit 260. Accordingly, the first region 261 of the support unit 260 may be formed at a position which secures the predetermined height H of the second region 262 and satisfies the distance D between the upper surface of the light emitting device 100 and the light transmission unit 230, of 0.15 mm to 0.35 mm, when the light transmission unit 230 is disposed. In order words, the position of the first region 261 of the support unit 260 and fixing methods of the first region 261 and the light transmission unit 230 and the like are determined to secure the predetermined height H of the second region 262 and satisfy the distance D between the upper surface of the light emitting device 100 and the light transmission unit 230, of 0.15 mm to 0.35 mm, when the light transmission unit 230 is disposed, but the position and the fixing method are not limited to specific examples of the embodiments.

When the distance D between the upper surface of the light emitting device 100 and the light transmission unit 230 is less than 0.15 mm, a minimum margin for wire bonding cannot be secured, and when the distance D exceeds 0.35 mm, a part of light generated in the light emitting device 100 is trapped in an edge C of the substrate 210 supporting the light transmission unit 230 and is thus not discharged to the outside, and light extraction efficiency is thus deteriorated.

For example, the light transmission unit 230 contacts a side 261-1 which faces a bottom surface of the substrate 210, in the first region 261 extending along the first direction from the end of the second region 262. A side of the light transmission unit 230 may contact the second region 262 of the support unit 260. Accordingly, in the present embodiment, a contact area between the light transmission unit 230 and the first region 261 is increased and the light transmission unit 230 can be thus stably fixed in the first region 261.

The sub-mount 220 may be disposed between the light emitting device 100 and the substrate 210. That is, the light emitting device 100 is disposed on the sub-mount 220, while being mounted on the substrate 210.

For example, the distance D between the upper surface of the light emitting device 100 and the light transmission unit 230 may be controlled by a thickness of the sub-mount 220. Alternatively, the distance D between the upper surface of the light emitting device 100 and the light transmission unit 230 may be controlled by changing a position of the first region 261 of the support unit 260.

Figure 9:
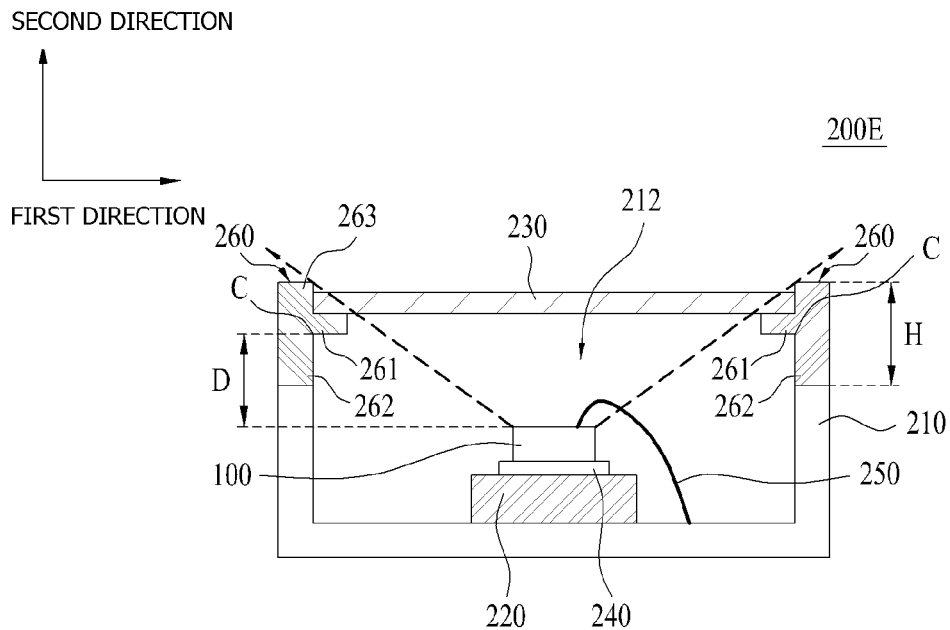
FIG. 9 is a cross-sectional view of a light emitting device package according to a fifth embodiment.

FIG. 9 is a cross-sectional view of a light emitting device package 200E according to a fifth embodiment.

Referring to FIG. 9, the light emitting device package 200E is an exemplary variation of the light emitting device package shown in FIG. 6, and the light transmission unit 230 is disposed on the first region 261 of the support unit 260 and is supported by the first region 261.

For example, an edge of the light transmission unit 230 is disposed on an upper surface of the first region 261 and is supported by the upper surface of the first region 261. For example, the edge of the light transmission unit 230 is fixed on the upper surface of the first region 261 by an adhesion member (not shown). The upper surface of the first region 261 may be a surface of the first region 261 which is opposite to a lower surface of the first region 261 and faces the bottom surface of the substrate 210.

Although the light transmission unit 230 is disposed in the first region 261, the distance D between the upper surface of the light emitting device 100 and the light transmission unit 230 may be 0.15 mm to 0.35 mm. For example, the distance D can be maintained within 0.15 mm to 0.35 mm and light output power can be improved by controlling a length of the sub-mount 220 or the second region 262 of the support unit 260.

Figure 10:
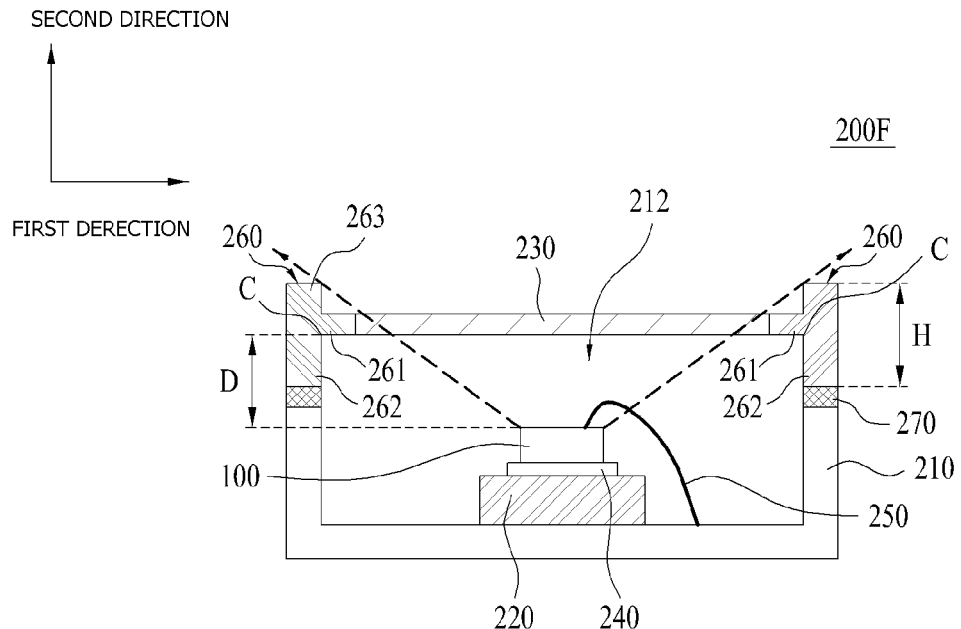
FIG. 10 is a cross-sectional view of a light emitting device package according to a sixth embodiment.

FIG. 10 is a cross-sectional view of a light emitting device package 200F according to a sixth embodiment.

Referring to FIG. 10, the light emitting device package 200F further includes an adhesion layer 270 which is disposed between the support unit 260 and the substrate 210 of the embodiment as shown in FIG. 6 and fixes the support unit 260 to the substrate 210.

For example, the adhesion layer 270 may be disposed between the second region 262 of the support unit 260 and the side wall of the cavity 212 of the substrate 210, and adheres the second region 262 of the support unit 260 to the side wall of the cavity 212.

Figure 11:
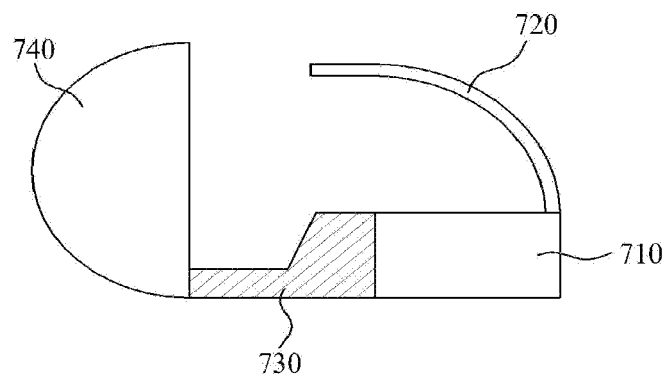
FIG. 11 is a view illustrating an embodiment of a head lamp including the light emitting device package according to the embodiments.

FIG. 11 is a view illustrating an embodiment of a head lamp including the light emitting device package according to the embodiments.

Referring to FIG. 11, light emitted from a light emitting module 710 including the light emitting device or light emitting device package according to the embodiments is reflected by a reflector 720 and a shade 730, is then transmitted to a lens 740 and is directed to a front of a body.

The light emitting module 710 may include a plurality of light emitting device packages mounted on a circuit substrate, but the present disclosure is not limited thereto.

Figure 12:
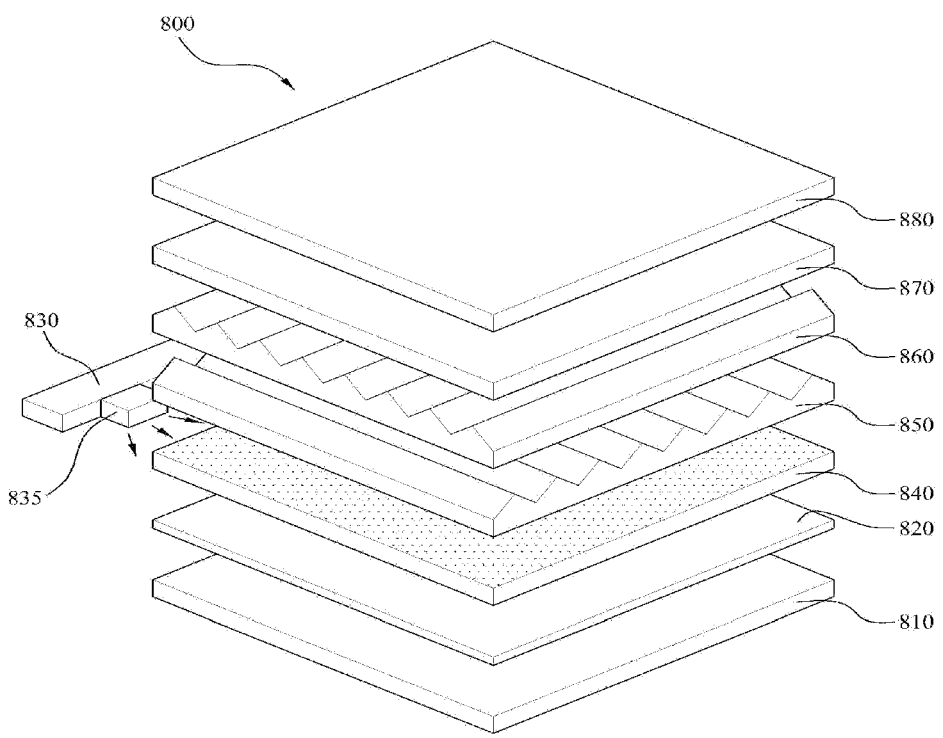
FIG. 12 is a view illustrating an embodiment of a display device including the light emitting device package according to the present embodiment.

FIG. 12 is a view illustrating an embodiment of a display device including the light emitting device package according to the present embodiment.

Referring to FIG. 12, the display device 800 according to the present embodiment includes light source modules 830 and 835, a reflective plate 820 disposed on a bottom cover 810, a light guide plate 840 which is arranged in front of the reflective plate 820 and guides light emitted the light source module toward the front of display device, a first prism sheet 850 and a second prism sheet 860 arranged in front of the light guide plate 840, a panel 870 arranged in front of the second prism sheet 860 and a color filter 880 arranged in front of the panel 870.

The circuit substrate 830 may be a PCB or the like. The light emitting device package 835 has been described above.

The bottom cover 810 may accommodate constituent components of the display device 800. The reflective plate 820 may be provided as a separate constituent component, as illustrated in the drawing, or may be coated with a material having a high reflectivity on the rear surface of the light guide plate 840 or the front surface of the bottom cover 810.

Here, the reflective plate 820 may be made of a material, for example, polyethylene terephthalate (PET), which has high reflectivity and is useful as in an ultra-thin film form.

The light guide plate 840 scatters light emitted from the light emitting device package module and uniformly distributes the light over the entire region of the screen of the liquid crystal display device. Accordingly, the light guide plate 840 is formed of a material having a high index of refraction and high transmissivity and examples of the material include polymethylmethacrylate (PMMA), polycarbonate (PC) and polyethylene (PE). Alternatively, the light guide plate may be omitted and an air guide through which light is transmitted may be formed above the reflective sheet 820.

The first prism sheet 850 is formed at a side of the support film using a light-transmitting and elastic polymer and the polymer may include a prism layer having a plurality of repeatedly formed three-dimensional structures. Here, the plurality of patterns, as illustrated in the drawing, may be provided as stripe patterns in which ridges and valleys repeatedly alternate.

A direction of the ridges and valleys arranged on one side of the support film in the second prism sheet 860 may be vertical to a direction of the ridges and valleys arranged on one side of the support film in the first prism sheet 850 so that light transferred from the light source module and the reflective plate can be uniformly distributed in all directions of the display panel 870.

In the present embodiment, the first prism sheet 850 and the second prism sheet 860 constitute an optical sheet and the optical sheet may be for example provided as another combination, for example, a micro lens array, a combination of a diffusion sheet and a micro lens array, or a combination of a prism sheet and a micro lens array.

The display panel 870 may be a liquid crystal panel and the liquid crystal panel 860 as well as other display device requiring a light source may be provided.

The display panel 870 has a structure in which a liquid crystal is disposed between glass bodies and a polarization plate is arranged on each glass body to polarize light. The liquid crystal has intermediate properties between a liquid and a solid. Liquid crystal is a unique organic molecule that has flowability like a liquid, although molecules thereof exhibit a regular arrangement like a crystal. An image is displayed based on a property that the molecular arrangement of liquid crystal is varied by an exterior electric field.

The liquid crystal panel used for display devices is an active matrix mode type and employs a transistor as a switch to control voltage supplied to respective pixels.

A color filter 880 is provided on the front surface of the panel 870 to enable respective pixels to transmit only red, green and blue light, among light emitted from the panel 870 and thereby display an image.

As is apparent from the above description, the embodiments set an optimum distance between a light emitting device and a light transmission unit to improve light extraction efficiency of a light emitting device package.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a substrate;
   a light emitting device disposed on the substrate;
   a light transmission unit disposed above the light emitting device, the light transmission unit being spaced from the light emitting device; and
   a support unit disposed on the substrate along a circumference of the substrate and supporting the light transmission unit,
   wherein the support unit includes:
      a first region disposed in a first direction parallel to the light transmission unit and contacting the light transmission unit; and
      a second region disposed in a second direction different from the first direction, and
   wherein a distance between an upper surface of the light emitting device and the light transmission unit is 0.15 mm to 0.35 mm.

2. The light emitting device package according to claim 1, wherein the first region extends along the first direction from an end of the second region.

3. The light emitting device package according to claim 1, wherein the first region extends along the first direction from a middle portion of the second region.

4. The light emitting device package according to claim 2, wherein the light transmission unit contacts a side of the first region, facing a bottom surface of the substrate.

5. The light emitting device package according to claim 1, wherein the light emitting device emits light having a wavelength range of 260 nm to 405 nm.

6. The light emitting device package according to claim 1, wherein the substrate comprises a ceramic material.

7. The light emitting device package according to claim 1, wherein the light emitting device is wire-bonded to the substrate.

8. The light emitting device package according to claim 1, wherein the first direction crosses the second direction at a right angle.

9. The light emitting device package according to claim 1, further comprising a sub-mount disposed between the substrate and the light emitting device.

10. The light emitting device package according to claim 1, wherein a space between the light-transmitting unit and the light emitting device is vaccumized.

11. The light emitting device package according to claim 1, wherein a space between the light-transmitting unit and the light emitting device is filled with a nitrogen gas or a forming gas.

12. The light emitting device package according to claim 1, wherein the light-transmitting unit comprises $SiO_2$, $Al_2O_3$, $LiF$, $MgF_2$, $CaF_2$, low iron transparent glass or $B_2O_3$.

13. The light emitting device package according to claim 1, wherein the support unit comprises at least one of Al, Ag, Pt, Rh, Rd, Pd and Cr, or an alloy containing at least one thereof.

14. The light emitting device package according to claim 1, wherein the light emitting device comprises:
   a light emitting structure including a first semiconductor layer doped with n-type dopant, a second semiconductor layer doped with p-type dopant, and an active layer disposed between the first semiconductor layer and the second semiconductor layer;
   a first electrode disposed on a side of the first semiconductor layer; and
   a second electrode disposed on a side of the second semiconductor layer.

15. The light emitting device package according to claim 14, wherein the light emitting device is a lateral light emitting device having a structure in which the first electrode and the second electrode are formed in the same direction with respect the light emitting structure.

16. The light emitting device package according to claim 14, wherein the light emitting device is a vertical light emitting device having a structure in which the first electrode and the second electrode are formed in different directions in the light emitting structure.

17. A light emitting device package comprising:
a substrate having a cavity including a side wall and a bottom surface;
a light emitting device disposed in the cavity;
a support unit including a first region, and a second region bent from the first region and dispose on the side wall of the cavity; and
a light-transmitting unit adhered to the first region such that the light-transmitting unit is spaced from the light emitting device, the light-transmitting unit transmitting light emitted from the light emitting device,
wherein a distance between the upper surface of the light emitting device and the light-transmitting unit is 0.15 mm to 0.35 mm.

18. The light emitting device package according to claim 17, wherein the light emitting device emits light having a wavelength range of 260 nm to 405 nm.

19. The light emitting device package according to claim claim 17, further comprising a sub-mount disposed between the substrate and the light emitting device.

20. The light emitting device package according to claim 17, wherein the substrate comprises a single layer or a plurality of layers.

\* \* \* \* \*